(12) United States Patent
Morimoto et al.

(10) Patent No.: US 7,700,964 B2
(45) Date of Patent: Apr. 20, 2010

(54) LIGHT EMITTING APPARATUS, DISPLAY APPARATUS AND METHOD FOR CONTROLLING LIGHT EMITTING APPARATUS

(75) Inventors: Taiji Morimoto, Onomichi (JP); Masanori Watanabe, Nishinomiya (JP)

(73) Assignee: Sharp Kabushiki Kaisha, Osaka (JP)

( * ) Notice: Subject to any disclaimer, the term of this patent is extended or adjusted under 35 U.S.C. 154(b) by 385 days.

(21) Appl. No.: 11/802,997

(22) Filed: May 29, 2007

(65) Prior Publication Data

US 2007/0284994 A1  Dec. 13, 2007

(30) Foreign Application Priority Data

May 29, 2006  (JP) .............................. 2006-148986

(51) Int. Cl.
*H01L 33/00* (2010.01)
(52) U.S. Cl. .............................. 257/98; 257/84; 257/88; 257/E33.001
(58) Field of Classification Search .................... 257/98
See application file for complete search history.

(56) References Cited

U.S. PATENT DOCUMENTS 6,513,949 B1  2/2003  Marshall et al.
2002/0063301 A1  5/2002  Hanamoto et al.
2002/0070681 A1*  6/2002  Shimizu et al. ............. 315/246
2003/0067773 A1*  4/2003  Marshall et al. ............. 362/231
2004/0217364 A1*  11/2004  Tarsa et al. ..................... 257/89
2007/0007494 A1  1/2007  Hirosaki et al.

FOREIGN PATENT DOCUMENTS

| JP | 2001-222904 | 8/2001 |
| JP | 2002-118292 | 4/2002 |
| JP | 2002-171000 | 6/2002 |
| JP | 2003-515956 | 5/2003 |

* cited by examiner

*Primary Examiner*—Wai-Sing Louie
(74) *Attorney, Agent, or Firm*—Morrison & Foerster LLP

(57) ABSTRACT

In a light emitting apparatus using LEDs, luminance and chromaticity of the LED changes largely due to a temperature change. Meanwhile, by using phosphors, it is possible to improve the stability of the luminance and chromaticity against the temperature change. However, color reproducibility of the light emitting apparatus decreases. Therefore, the light emitting apparatus includes a first LED, a second LED, a first phosphor which is excited by the second LED and emits light whose color is the same as or similar to a color of light emitted from the first LED, and a control circuit which controls a ratio between an emission intensity of the first LED and an emission intensity of the second LED.

26 Claims, 12 Drawing Sheets (a)

(b)

(a)

(b)

US 7,700,964 B2

LIGHT EMITTING APPARATUS, DISPLAY APPARATUS AND METHOD FOR CONTROLLING LIGHT EMITTING APPARATUS

This Nonprovisional application claims priority under 35 U.S.C. § 119(a) on Patent Application No. 148986/2006 filed in Japan on May 29, 2006, the entire contents of which are hereby incorporated by reference.

FIELD OF THE INVENTION

The present invention relates to a light emitting apparatus which uses LEDs and phosphors, a non light emitting display apparatus which includes the light emitting apparatus as a light source, and a method for controlling the light emitting apparatus.

BACKGROUND OF THE INVENTION

In recent years, developments of a configuration using, as a light source of a backlight used in a liquid crystal display apparatus, a light emitting diode (hereinafter referred to as "LED") instead of a conventional cold cathode fluorescent tube (hereinafter referred to as "CCFL") have been advanced. Especially, as compared with a conventional CCFL tube backlight, an LED backlight which uses LEDs of three primary colors (red, green and blue) is characterized in that its color reproduction region (NTSC ratio, CIE1931) is large. This is because a half band width of an emission spectrum of the LED is narrow, and RGB colors which are respectively close to their pure colors can be obtained. Moreover, since the brightness of the LEDs of each color can be adjusted by the amount of current, balance among the colors can be changed. Further, unlike the CCFL, the LED does not contain mercury, so that it excels in environment-friendliness.

In addition, LED lighting apparatuses including LEDs are increasingly used as light sources for general lighting other than for liquid crystal display apparatuses. Especially, since an apparatus including LEDs of three primary colors (red, green and blue) can control emission intensities of three primary colors, it is possible to stabilize or change a color temperature of the light source.

However, regarding the LED lighting apparatus including the red LEDs, the green LEDs and the blue LEDs, when the brightness of the three colors changes or the balance among the three colors changes, the brightness and/or color of an object to be illuminated changes. When using the LED lighting apparatus as the backlight of the liquid crystal display apparatus, the number of LEDs used is large, so that slight changes in the brightness or color of each LED are perceived as uneven luminance or uneven color of the entire liquid crystal image.

Currently, to obtain high luminance, it is desirable to use an AlGaInP based semiconducting material as the red LED, and an AlGaInN based semiconducting material as the green LED and the blue LED. Since the half band width of the emission spectrum of the red LED using the AlGaInP based semiconducting material is narrow (about 20 nm), this red LED excels in monochromaticity. By using this red LED, it is possible to increase the color reproduction region of the liquid crystal display apparatus. However, a lowering rate of the luminance of the AlGaInP based red LED at the time of temperature rise is higher than that of the AlGaInN based LED. Moreover, a change in a peak wavelength of the emission spectrum of the AlGaInP based red LED is larger than that of the AlGaInN based LED. Further, as the temperature increases, the emission spectrum of the red LED shifts toward a long wavelength side. In light of visibility characteristics of humans, this change is a wavelength shift that is deterioration for the visibility. Therefore, even if the emission intensity of the AlGaInP based red LED is the same as that of the AlGaInN based LED, the AlGaInP based red LED looks dark to the human eye. Further, since the emission intensity itself of the AlGaInP based red LED decreases as the temperature rises, two disadvantageous factors occur, and this leads to decrease in the emission intensity of a red component perceived by the human eye as the backlight. In light of the coloring of the backlight, this decrease relatively increases percentages of blue and green components, so that the color reproducibility is deteriorated. To compensate for the decrease in the red component, the current flowing to the LED has been increased. However, this causes problems, such as increase in power consumption, increase in the amount of heat generated, and decrease in reliability.

To deal with these problems, FIG. 1 of Japanese Unexamined Patent Publication No. 222904/2001 (Tokukai 2001-222904, published on Aug. 17, 2001) shows a light source which uses light emission from a phosphor which converts exciting light of the blue LED to generate red light emission. This significantly mends the problem of the change in a color tone due to the temperature change.

FIG. 1 of Japanese Unexamined Patent Publication No. 118292/2002 (Tokukai 2002-118292, published on Apr. 19, 2002) shows a light source which emits three primary colors using blue LEDs as excitation light sources, and green and red phosphors.

FIG. 3 of Published Japanese Translation of PCT International Publication for Patent Application No. 515956/2003 (Tokuhyo 2003-515956, published on May 7, 2003) shows an LED lighting system which uses a light source including, for example, red LEDs, green LEDs and phosphors which are excited by blue LEDs to emit red light.

When using, as a red phosphor, $0.5MgF_2.3.5MgO.GeO_2$:Mn shown in FIG. 2 of Japanese Unexamined Patent Publication No. 171000/2002 (Tokukai 2002-171000, published on Jun. 14, 2002), the half band width of the red phosphor is narrower than that of the red LED, so that it may be possible to obtain the excellent color reproduction region. Meanwhile, the pamphlet of International Publication No. 2005/052087 (published on Jun. 9, 2005) reports that a wavelength conversion efficiency of a nitride based phosphor is excellent. The half band width of the emission spectrum of this nitride based phosphor is wider (about 60 nm) than that of the red LED. Therefore, this phosphor is excellent as general lighting, but has been thought to be not suitable for a liquid crystal backlight whose color reproduction region is large.

The light emitting apparatus which uses only LED chips excels in the color reproducibility, but the problem is that the luminance and chromaticity of the LED changes largely by the temperature change. Meanwhile, the light emitting apparatus in which LED chips of one specific color are replaced with phosphors excited by an LED light source(s) can improve the stability of the luminance and chromaticity with respect to the temperature change. However, when the half band width of the emission spectrum the phosphor is wide, the problem is that the color reproducibility of the display apparatus deteriorates.

SUMMARY OF THE INVENTION

An object of the present invention is to provide (I) a light emitting apparatus which can obtain both of or select one of (i) as high a color reproducibility as possible while securing the reliability of the apparatus and (ii) necessary luminance in accordance with conditions, such as an operation environment, a state of an image, and a status of use, and (II) a display apparatus which includes the above light emitting apparatus and can carry out display which appears to be beautiful to the human eye in accordance with an operation environment, a state of an image, a status of use, etc.

A light emitting apparatus of the present invention includes: a first LED; a second LED; a first phosphor which is excited by the second LED and emits light whose color is the same as or similar to a color of light emitted from the first LED; and a control circuit which controls a ratio between an emission intensity of the first LED and an emission intensity of the second LED.

Regarding at least one color in the light emitting apparatus, an LED chip and a light source of a phosphor which is excited by light emitted from another LED chip and emits light similar to that of the above LED are combined with each other, and the control circuit accordingly adjusts a light emission ratio between the LED chip and the light source of the phosphor in accordance with conditions, such as luminance, temperature and chromaticity. Thus, it is possible to obtain the light emitting apparatus which can obtain both of or select one of (i) as high a color reproducibility as possible while securing the reliability of the apparatus and (ii) necessary luminance in accordance with conditions, such as an operation environment, a state of an image, and a status of use.

Moreover, by using this light emitting apparatus as a light source for a non light emitting display panel, it is possible to obtain a display apparatus which can carry out display which appears to be beautiful to the human eye in accordance with an operation environment, a state of an image, a status of use, etc.

Moreover, in this light emitting apparatus, it is possible to carry out preferable light emission by providing a specific control method corresponding to an emission intensity, temperature or chromaticity.

Additional objects, features, and strengths of the present invention will be made clear by the description below. Further, the advantages of the present invention will be evident from the following explanation in reference to the drawings.

DESCRIPTION OF THE EMBODIMENTS

The following will explain embodiments of the present invention.

Embodiment 1

Figure 1:
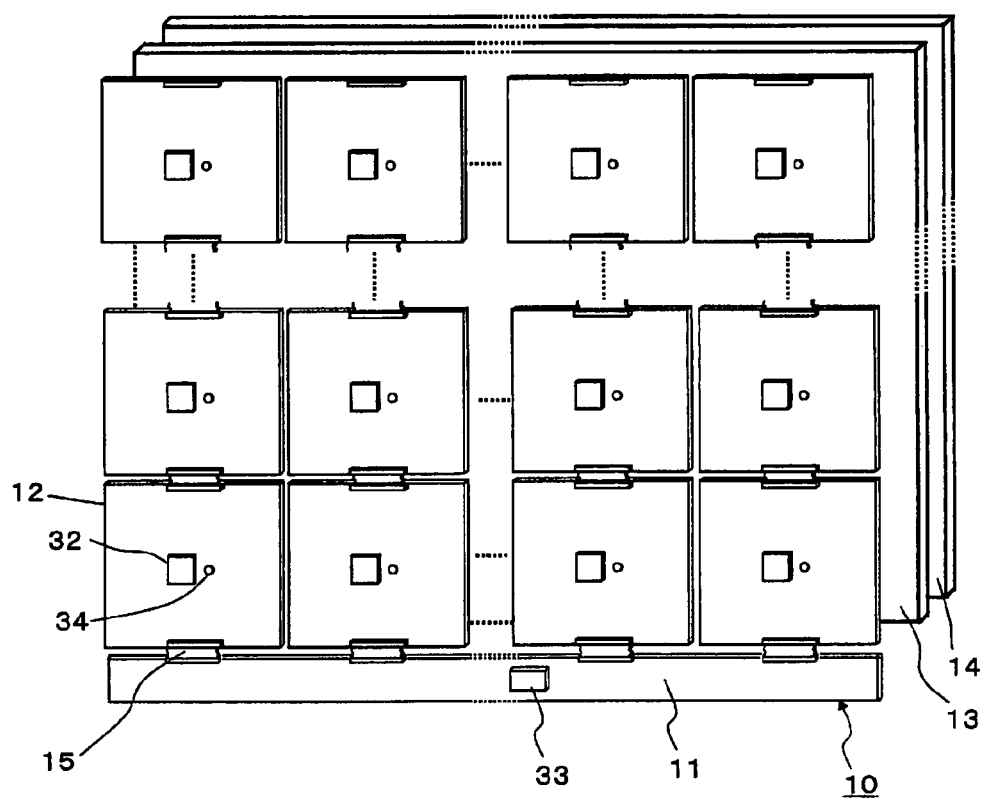
FIG. 1 is a block diagram of a liquid crystal display apparatus of Embodiment 1 when viewed from its back surface.

FIG. 1 is a block diagram of a liquid crystal display apparatus 10 of Embodiment 1. A plurality of backlight tiles 12 illuminate a liquid crystal panel 14 via a diffuser plate 13. A drive circuit 32 is mounted on a back surface (surface shown in FIG. 1) of the backlight tile 12. In addition, a temperature sensor 34 may be mounted. Note that the temperature sensor 34 is not used in the first operation described below. Moreover, the temperature sensor 34 may be mounted on each backlight tile 12, or may be mounted on only one backlight tile 12 or representative backlight tiles 12. The drive circuit 32 and the temperature sensor 34 are connected via a cable 15 to a control circuit 33 provided on a control substrate 11 common to the backlight tiles 12. Note that it is possible to configure the display apparatus even if the liquid crystal panel 14 is replaced with a non light emitting image display panel, such as an MEMS (microelectromechanical system) panel or a shutter panel which uses an electrooptic effect or an electrophoretic effect.

Figure 2:
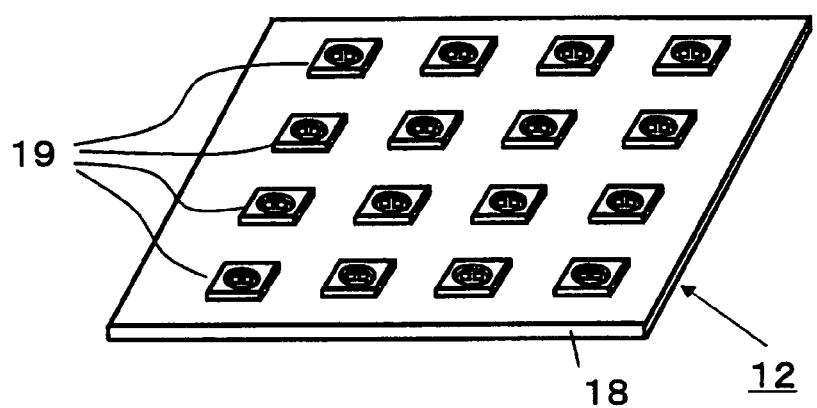
FIG. 2 is a schematic diagram showing a surface of a backlight tile of Embodiment 1.

FIG. 2 shows a front surface (not shown in FIG. 1) of the backlight tile 12. The backlight tile 12 is made by providing a large number of LED groups 19 on a substrate 18.

Figure 3:
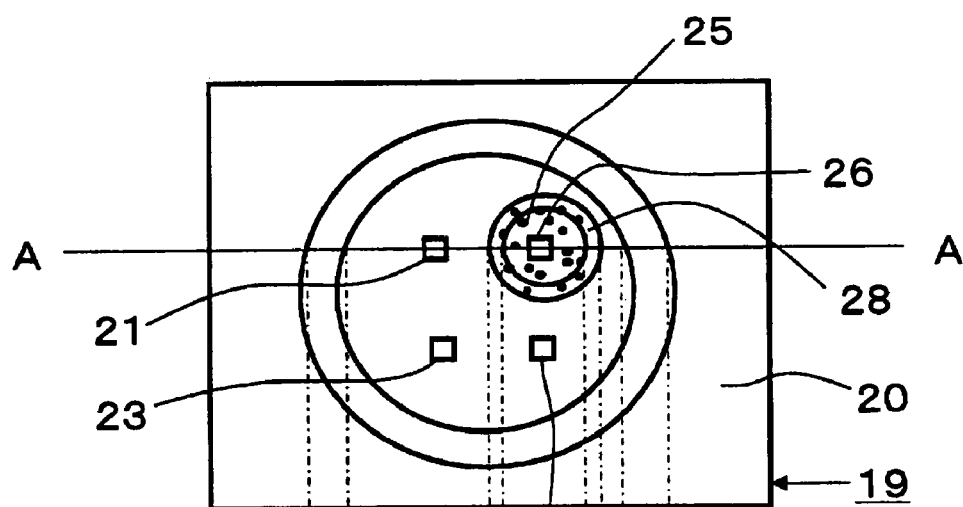
FIG. 3($a$) is a top view of an LED group used in Embodiment 1, and FIG. 3($b$) is a cross-sectional diagram of the LED group.
Figure 3:
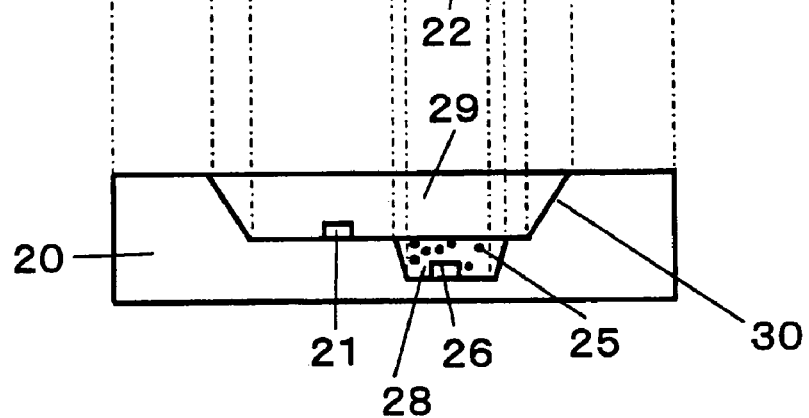

As shown in FIG. 3($a$) of the top view and FIG. 3($b$) of the cross-sectional diagram, in each LED group 19, the blue LED chip 21, the green LED chip 22, the red LED chip 23 and an excitation blue LED chip 26 are mounted on a package 20 whose inner surface illuminated by light from the LED chips is a reflection surface 30. The excitation blue LED chip 26 is covered by a resin 28, and the red light emitting phosphors 25 are dispersed in the resin 28. Regarding a surface, on which the LED chips are mounted, of the package 20, a portion where the excitation blue LED chip 26 is mounted is deeper than the other portion so that the resin 28 does not cover anything other than the excitation blue LED chip 26. The excitation blue LED chip 26 functions as an excitation light source which excites the red light emitting phosphors 25, but a component having been scattered or penetrated without exciting the phosphors contributes as a blue light source together with the blue LED chip 21. The LED group 19 is entirely covered by a resin 29, such as silicone not containing phosphors.

The blue LED chip 21, the green LED chip 22 and the excitation blue LED chip 26 are InGaN based LEDs, and the red LED chip 23 is an AlGaInP based LED. In this explanation, a plurality of LED chips are included in one package as a group, but a package may be prepared for each LED chip. Moreover, the LED chip may be directly mounted on the substrate 18.

The red light emitting phosphor 25 is a red light emitting phosphor which is shown by a composition of $CaAlSiN_3$: $Eu^{2+}$. This material is a nitride phosphor, and has a satisfactory stability similar to that of silicon nitride. Therefore, this material is advantageous in that it hardly deteriorates by a step of mixing with moisture or resin. Moreover, as the red light emitting phosphor, this material is one of materials having most excellent light emitting efficiency.

As the LED group, an LED group 19B shown in FIG. 4(a) of the top view and FIG. 4(b) of the cross-sectional diagram may be used. In the LED group 19B, the LED chips 21, 22, 23 and 26 mounted on the package 20 are respectively covered by different resins 29A, 29B, 29C and 28A (the red light emitting phosphors 25 are dispersed in the resin 28A). Therefore, unlike the case where the LED chips 21, 22, 23 and 26 are entirely covered by the resin, each of the resins 29A, 29B and 29C and the reflection surface 30 of the package are separated from each other, so that the problem of detachment of the resin at this interface does not occur. Moreover, an efficiency of utilizing light is satisfactory.

Moreover, the LED group may use a package 20B shown in FIG. 4(c) that is the cross-sectional diagram. The package 20B is a package which does not have the reflection surface 30, to be illuminated by light from the LED chip, of the package 20. Unlike the case where the reflection surface 30 is provided, light becomes wide by not providing the reflection surface 30. Therefore, the package 20B is preferable when it is necessary to use uniform illumination as a light source for the backlight. Meanwhile, when the reflection surface 30 is provided, an advantage is that the percentage of light incident on the liquid crystal panel 14 at an angle close to a right angle becomes high. Therefore, it is desirable to properly use the LED group having the reflection surface 30 or the LED group not having the reflection surface 30 depending on characteristics, etc. of the liquid crystal panel 14.

Figure 5:
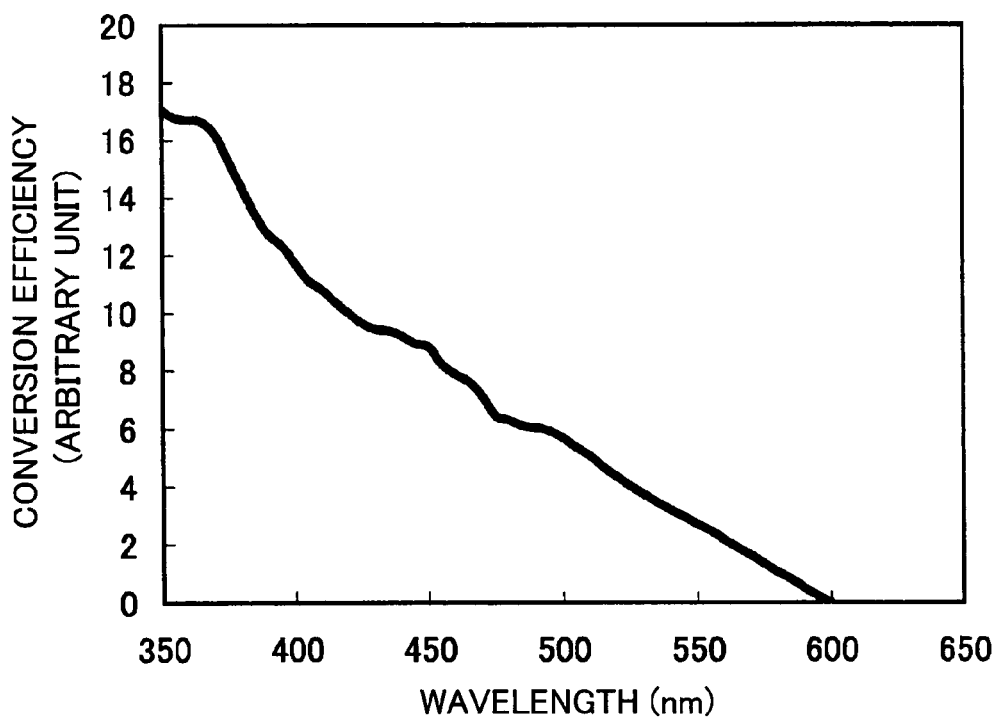
FIG. 5 shows dependency of a conversion efficiency with respect to an excitation wavelength of a red light emitting phosphor of Embodiment 1.

According to the dependency of the conversion efficiency with respect to the excitation wavelength of the red light emitting phosphor 25 as shown in FIG. 5, it is recognized that (i) the conversion efficiency increases as the peak wavelength of the excitation light source is shorter, and (ii) it is especially preferable that the peak wavelength be 470 nm or less since the blue light can be efficiently converted into red light, and light which has not been used for excitation can be utilized as the blue light source. Therefore, each of the blue LED chip 21 and the excitation blue LED chip 26 is the AlGaInN based light emitting diode whose peak wavelength of the emission spectrum is shorter than 470 nm (for example, 450 nm). In light of the efficiency of the red light emission, it is advantageous to replace the excitation blue LED chip 26 with, for example, a purple LED whose peak wavelength is 420 nm or less (for example, 405 nm) or an ultraviolet LED whose peak wavelength is 400 nm or less. In this case, designing and/or controlling are realized so that the blue light can be sufficiently obtained only by the blue LED chip 21.

The LED chip is covered by the resin, because this has an effect of preventing (i) changes in characteristics due to moisture absorption, etc., (ii) mechanical damages at the time of an assembly operation, (iii) etc. Moreover, a refractive index of the resin made of silicone is about 1.4 to 1.5, and is higher than that of air (refractive index: 1) and lower than that of the LED chip (for example, 2 or more). Therefore, this improves the efficiency of utilizing light.

The blue LED chip 21, the green LED chip 22, the red LED chip 23 and the excitation blue LED chip 26 are driven by the drive circuit 32. A drive signal is a PWM (pulse width modulation) signal, but may be an analog signal which changes a current value. The drive circuit 32 is controlled by a control signal transmitted from the control circuit 33 in accordance with the first operation or the second operation described below.

Figure 4:
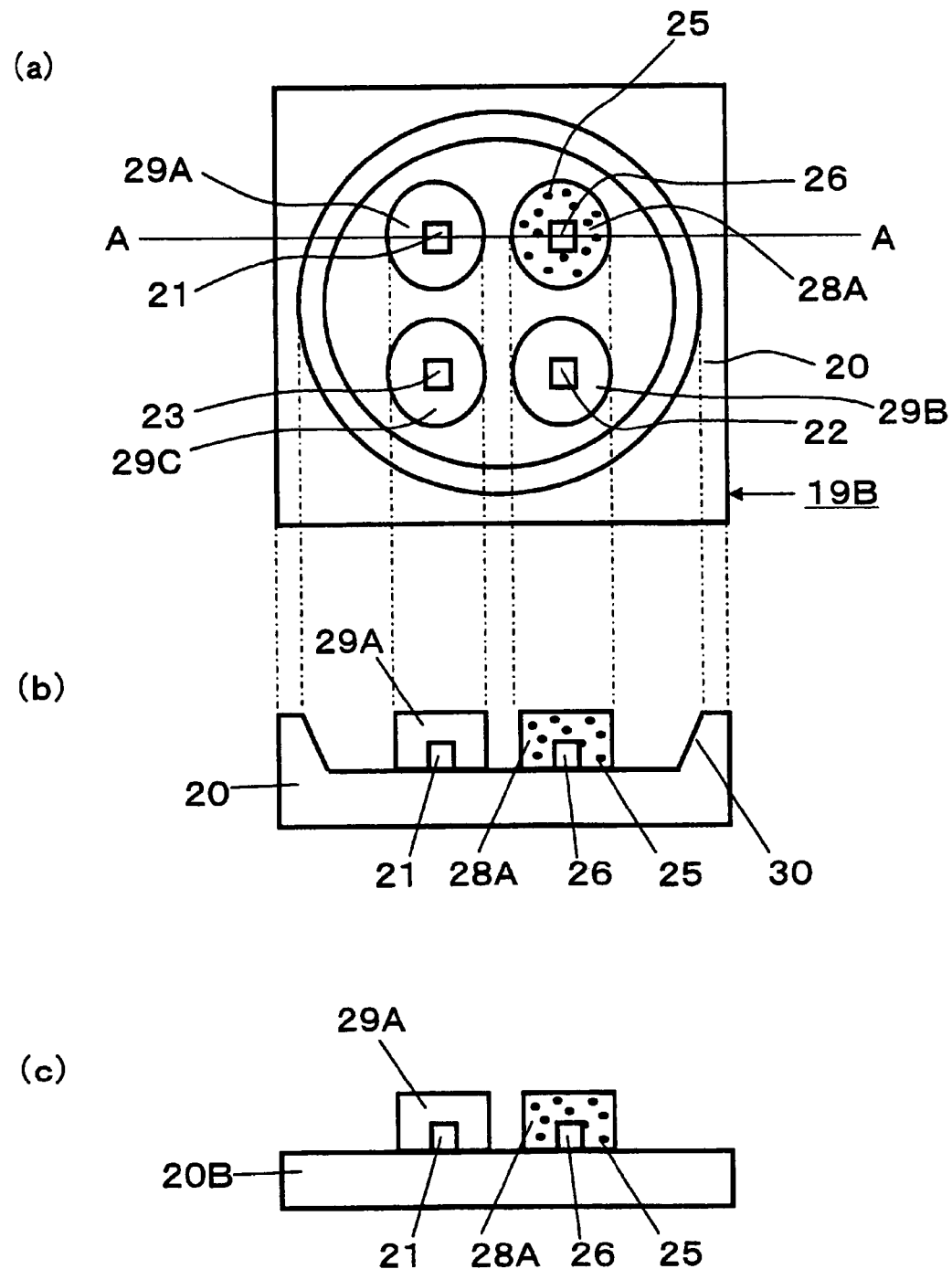
FIG. 4($a$) is a top view of another LED group used in Embodiment 1, FIG. 4($b$) is a cross-sectional diagram of the LED group, and FIG. 4($c$) is a cross-sectional diagram of a modification example of the LED group.

The number of LED chips in the LED group 19 or 19B may be changed so that the balance among the colors is optimized in the case of combining the emission intensities of the LED chips. For example, two green LED chips may be used. Moreover, two red LED chips may be used. In FIGS. 3 and 4, the number of LED chips is four. However, even if the number of LED chips is three, or five or more, there is no problem in light of the spirit of the present invention.

(Color Reproducibility)

Figure 6:
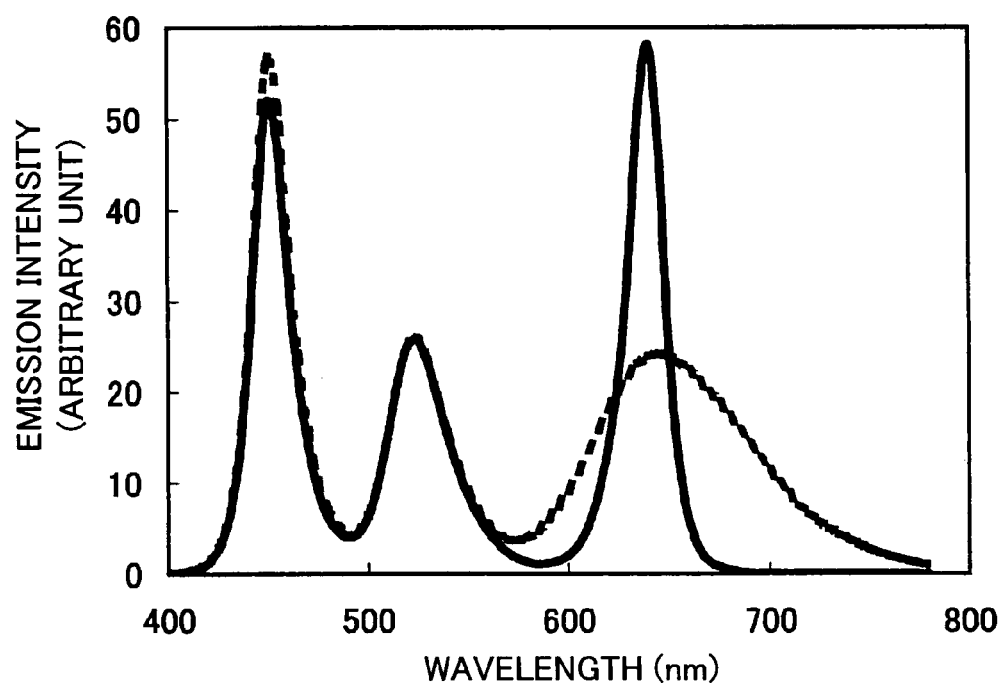
FIG. 6 shows an emission spectrum distribution when a blue LED chip 21, a green LED chip 22 and a red LED chip 23 are used in Embodiment 1 and an emission spectrum distribution when the blue LED chip 21, the green LED chip 22 and a red light emitting phosphor 25 are used in Embodiment 1.
Figure 7:
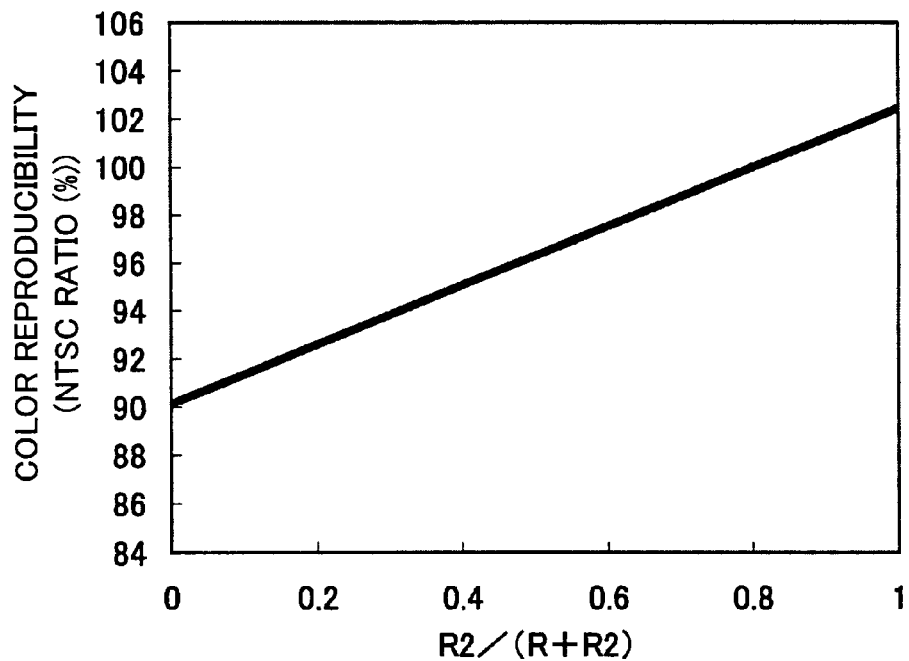
FIG. 7 is a diagram showing changes in a color reproducibility when a ratio between an emission intensity of the red LED chip 23 and an emission intensity of the red light emitting phosphor 25 is changed in Embodiment 1.

The LED group 19 includes both the red LED chip 23 and the red light emitting phosphor 25. Therefore, the light emission ratio between the red LED chip 23 and the red light emitting phosphor 25 can be changed, and this changes the color reproducibility. In FIG. 6, a solid line shows the emission spectrum distribution when a white color is produced by using the blue LED chip 21, the green LED chip 22 and the red LED chip 23, and a dotted line shows the emission spectrum distribution when the white color is produced by using the blue LED chip 21, the green LED chip 22 and the red light emitting phosphor 25. By comparison between these emission spectrum distributions, it is found that a red portion of the spectrum becomes broad by using the red light emitting phosphor 25. FIG. 7 shows the color reproducibility (NTSC ratio) when varying R2/(R+R2) where R denotes the emission intensity of the red LED chip 23, and R2 denotes the emission intensity of the red light emitting phosphor 25 (at a temperature of 25° C.). It is recognized that the color reproducibility changes depending on the ratio between the emission intensity of the red LED chip 23 and the emission intensity of the red light emitting phosphor 25.

The emission spectrum distribution when the temperature is changed is also measured. In light of spectral characteristics of blue, green and red color filters formed on the liquid crystal panel 14, temperature dependency of the color reproducibility in the liquid crystal display apparatus is obtained in the following manner.

A left column of Table 1 below shows calculation results of the color reproducibility (NTSC ratio) of the liquid crystal display apparatus 10 when only the red LED is used and when only the red light emitting phosphor is used. As a comparative example, Table 1 also shows the color reproducibility in the liquid crystal display apparatus which uses a conventional three band cold-cathode tube backlight. As is clear from Table 1, the color reproducibility (NTSC ratio) of a liquid crystal backlight which uses the backlight tile 12 is more excellent than that of the comparative example both when only the red LED is used and when only the red light emitting phosphor is used.

TABLE 1

|  | NTSC Ratio | | Red Light Emission Intensity | |
| --- | --- | --- | --- | --- |
|  | 25° C. | 100° C. | 25° C. | 100° C. |
| Red LED Only | 102% | 99% | 100% | 69% |
| Red Light Emitting Phosphor Only | 90% | 86% | 100% | 79% |
| Comparative Example | 73% | 71% | | |

Meanwhile, as shown in a right column of Table 1, the temperature dependency of the emission intensity of the red light source when only the red LED is used is larger than that when only the red light emitting phosphor is used. This indicates that when only the red LED is used, and the temperature is high, it is necessary to steeply increase a current to compensate for decrease in the emission intensity. According to Table 1, to maintain the same luminance when the temperature is increased from 25° C. to 100° C., it is necessary to increase the current by 45% (100/69=1.45), and this is a tough drive condition in light of the reliability of the red LED. The present inventors have found that by accordingly adjusting the light emission ratio between the red LED and the red light emitting phosphor in the following manner for example, the decrease in the reliability due to the influence of the temperature change is suppressed, and this suppression is balanced with satisfactory color reproducibility. Thus, for example, it is possible to select a drive method for giving priority to the reliability of the light emitting apparatus while sacrificing the color reproducibility to some extent.

(Operation Corresponding to the Luminance of the Liquid Crystal Display Apparatus)

Figure 8:
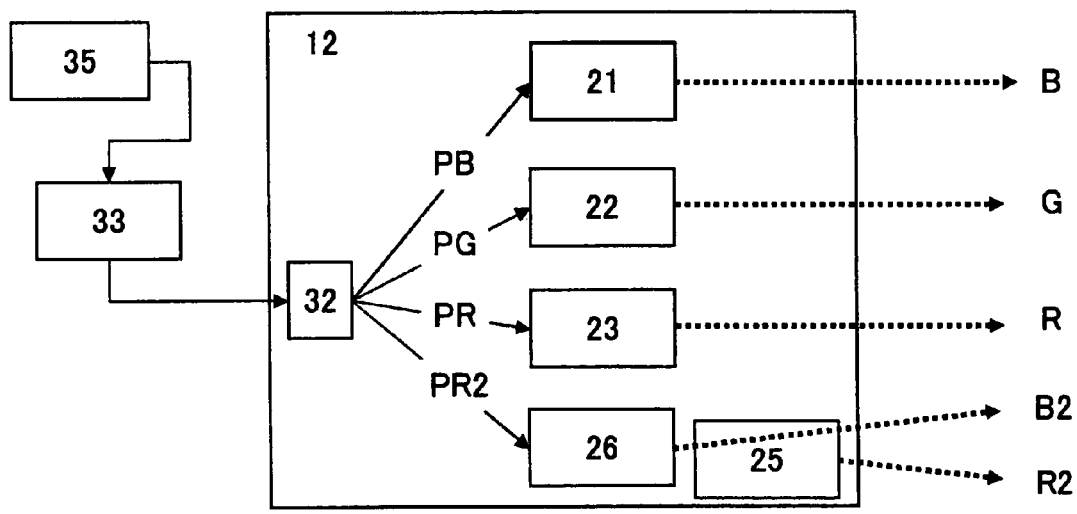
FIG. 8 is a circuitry diagram when a first operation is carried out in Embodiment 1.

A first control program is supplied to the control circuit 33, and the first operation is carried out. FIG. 8 shows a circuitry diagram at the time of the present operation. A luminance signal 35 is supplied to the control circuit 33, the drive signal generated in accordance with the first control program supplied in the control circuit 33 is transferred to the drive circuit 32 in each backlight tile 12. The drive circuit 32 drives the blue LED chip 21, the green LED chip 22, the red LED chip 23 and the excitation blue LED chip 26 respectively by drive signals PB, PG, PR and PR2, and the blue LED chip 21, the green LED chip 22, the red LED chip 23 and the excitation blue LED chip 26 respectively emit light B, light G, light R and light B2. A part of the light B2 becomes light R2 by the red light emitting phosphor 25. Note that there may be a plurality of control circuits 33, and the control circuit 33 may be provided in each backlight tile.

Figure 9:
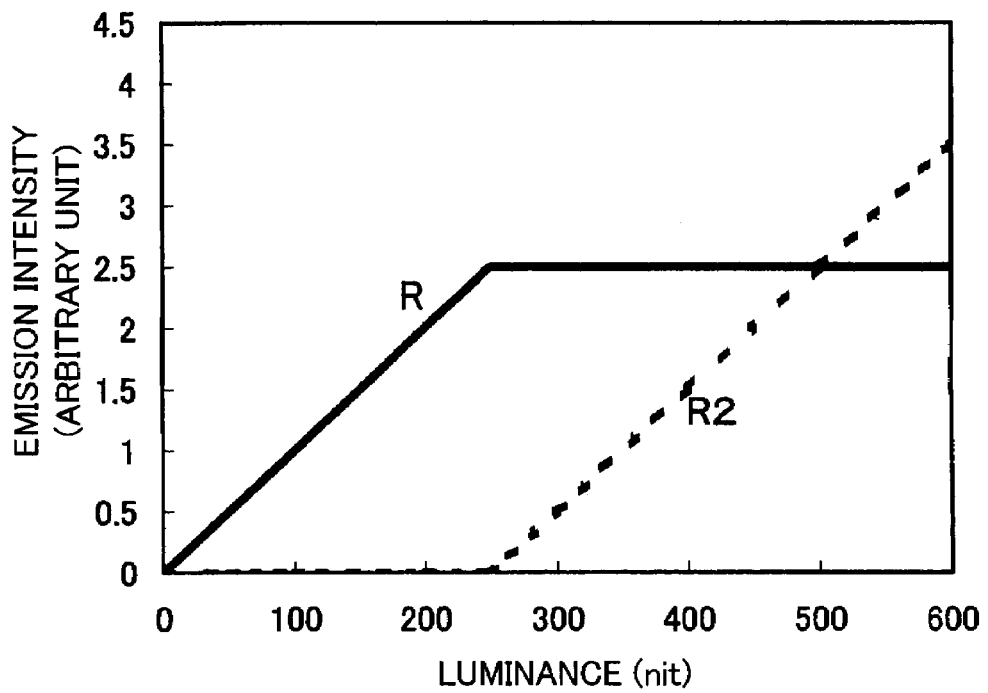
FIG. 9 shows a control program of the first operation in Embodiment 1.

In FIG. 9, a solid line shows the emission intensity (R) of the red LED chip 23 with respect to the luminance of the liquid crystal display in the first control program, and a dotted line shows the emission intensity (R2) of the red light emitting phosphor 25 with respect to the luminance of the liquid crystal display in the first control program. At the time of low luminance (250 nit (cd/m$^2$) or less in FIG. 9), only the red LED is used. When the luminance is 250 nit or more, the red light emitting phosphor 25 is used for the increased luminance. Note that the luminance to be displayed may be set manually by a person who watches the liquid crystal display, or may be set automatically by detecting, with an optical sensor, illuminance in a surrounding environment and increasing the luminance when the surrounding environment is bright. In the case of the moving picture, it is effective to increase the luminance by the light emission of the phosphor. This is because (i) since the human eye tends to recognize the luminance of the moving picture low, the high luminance is required, and (ii) since it is difficult for the human eye to recognize the color of the moving image, the color reproducibility may be decreased to some extent.

Since the amount of current flowing to the red LED can be suppressed by a control method for compensating for this increased luminance by the light emission of the phosphor, the deterioration of the red LED can be suppressed, and an advantageous effect can be obtained in light of the reliability.

Note that the luminance of the backlight tile 12 itself is about 15 times to 30 times the luminance of the liquid crystal display apparatus 10.

In light of an actual installation environment of the liquid crystal display, satisfactory display can be obtained even if a white screen display of the liquid crystal display apparatus is operated with the low luminance (250 nit or less) in a room into which direct sunlight does not come. Therefore, in the case of the low luminance, by setting the amount of light from the red LED so that this amount is larger than the amount of light from the red light emitting phosphor, it is possible to provide a person who watches the liquid crystal display with a beautiful image whose color reproducibility is excellent.

Figure 10:
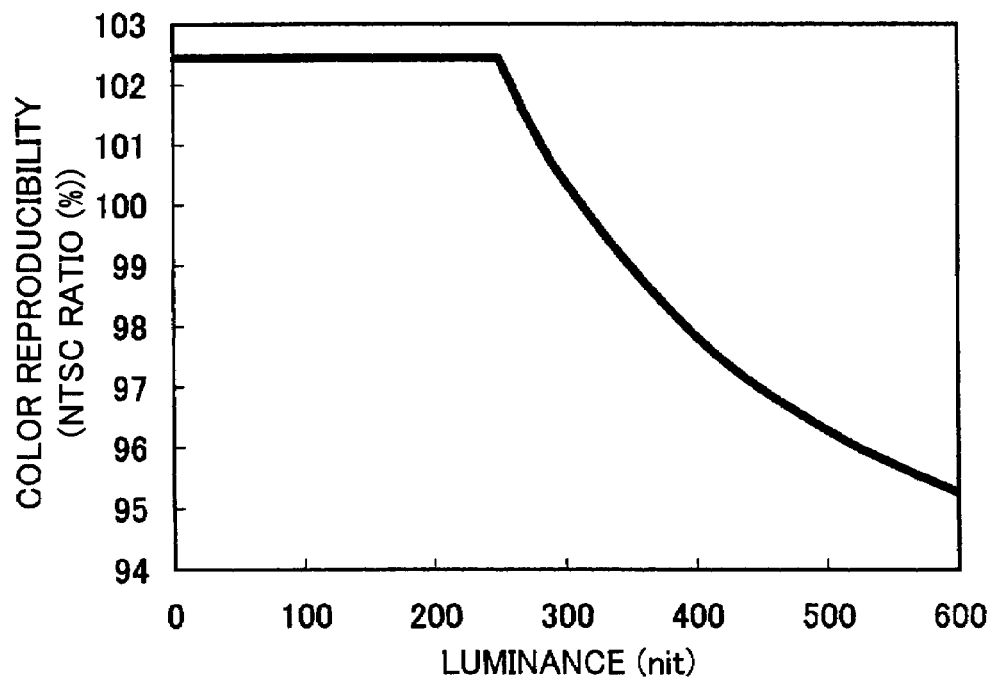
FIG. 10 shows calculation results of the color reproducibility in the case of the first operation in Embodiment 1.

Meanwhile, in the case of an unfavorable visual environment (such as an outdoor environment or a room into which direct sunlight comes), high luminance (400 nit or more) is desirable to overcome the brightness of the surrounding, such as reflection of light in the liquid crystal display. In this case, since the visual environment is bad, there is not much point in giving priority to the color reproducibility, and the high luminance is the most important factor. As shown in FIG. 10, in the liquid crystal display apparatus of the present embodiment, satisfactory color reproducibility can be obtained when the luminance is low (250 nit or less), and the color reproducibility decreases as the luminance increases. With this, it is possible to provide a person who watches the liquid crystal display with such an image that is recognized as a very beautiful image in various environments. The boundary between the low luminance operation and the high luminance operation is 250 nit here. However, this is just one example, and the boundary may be the other value (for example, a value in a range from 50 nit to 400 nit). Moreover, the boundary may be changed in accordance with the temperature so as to be low luminance at high temperature.

(Operation Corresponding to the Temperature of the Liquid Crystal Display Apparatus)

Next, a second control program is supplied to the control circuit 33, and the second operation is carried out. Note that the luminance is constant (250 nit). In the case of carrying out a feedback control of stabilizing the luminance when not using the red light emitting phosphor, power supplied to the red LED chip increases as the temperature increases since the temperature dependency of the red LED chip is high as shown in Table 1. Since this increase causes decrease in the amount of light emitted, thermal runaway may occur. Here, as the second operation, when the temperature detected by the temperature sensor 34 further included in the backlight tile 12 is lower than a constant value, only the red LED chip is driven (or the red LED chip is mainly driven), and when it is higher than the constant value, the percentage of light emitted from the red light emitting phosphor is increased. Thus, it is possible to maintain constant luminance even at high temperature while preventing the thermal runaway.

Figure 11:
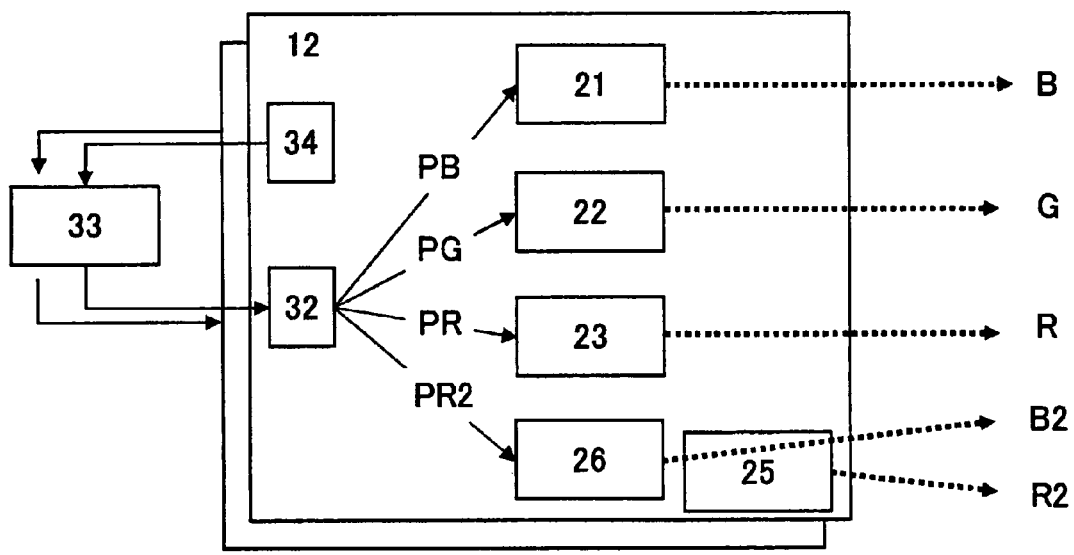
FIG. 11 is a circuitry diagram when second to fourth operations are carried out in Embodiment 1.

FIG. 11 shows a circuitry diagram of the present operation. A temperature signal is supplied from the temperature sensor 34 of each backlight tile 12 to the control circuit 33, and the drive signal (drive signals are different from each other among the tiles) generated in accordance with the second control program supplied in the control circuit 33 is transferred to the drive circuit 32 in each backlight tile 12. The drive circuit 32 drives the blue LED chip 21, the green LED chip 22, the red LED chip 23 and the excitation blue LED chip 26 respectively by the drive signals PB, PG, PR and PR2, and the blue LED chip 21, the green LED chip 22, the red LED chip 23 and the excitation blue LED chip 26 respectively emit the light B, the light G, the light R and the light B2. A part of the light B2 becomes the light R2 by the red light emitting phosphor 25. Note that there may be a plurality of control circuits 33, and the control circuit 33 may be provided in each backlight tile.

Figure 12:
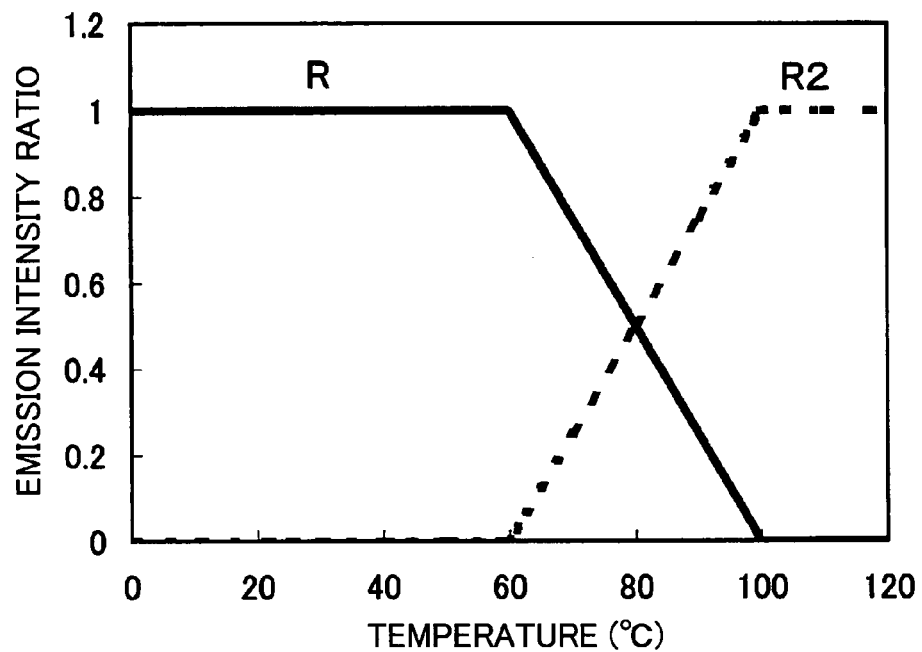
FIG. 12 shows a control program of the second operation in Embodiment 1.
Figure 13:
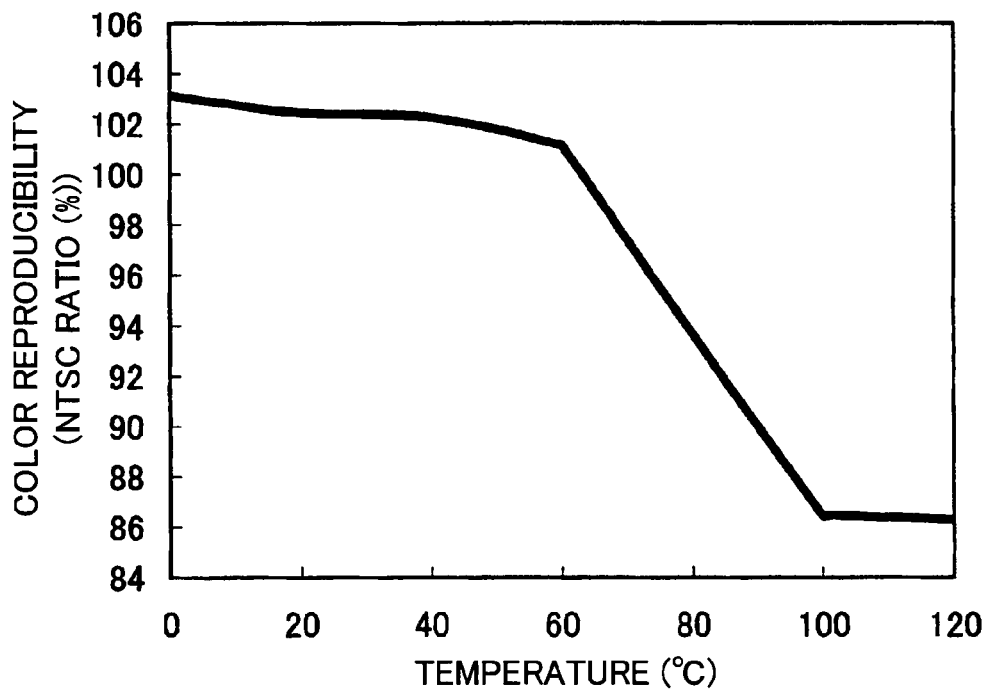
FIG. 13 shows calculation results of the color reproducibility in the case of the second operation in Embodiment 1.

FIG. 12 shows one example of the temperature and a set value of a control ratio between LED emission intensities in the control program. Only the red LED chip 23 is driven as the red light source when the ambient temperature of the LED package is up to 60° C., and only the excitation blue LED chip 26 is driven when the ambient temperature of the LED package is 100° C. FIG. 13 shows calculation results of the NTSC ratio in this case. The peak wavelength of the red LED chip shifts toward the long wavelength side as the temperature increases, and its intensity decreases. To compensate for the intensity, it is necessary to increase the current even in the case of the same emission intensity. However, heat generation of the red LED chip increases, and the life of the red LED chip decreases in light of the reliability. Therefore, by mainly using the light emission of the red phosphor at high temperature and suppressing the current of the red LED chip, the life of the light emitting apparatus is secured while sacrificing the color reproducibility to some extent. Note that the same is true for, for example, the yellow LED other than the red LED.

For ease of explanation, the first operation corresponding to the luminance and the second operation corresponding to the temperature are described separately. However, an operation that is a combination of the above two operations is more desirable. That is, the backlight tile 12 is controlled by the control circuit 33 having a program which changes the ratio between average applied powers to the red LED chip 23 and the excitation blue LED chip 26 in accordance with two parameters that are the luminance and the temperature.

The temperature sensor 34 is used when carrying out the second operation. However, the temperature can be detected, without the temperature sensor, by detecting, for example, a forward current of the red LED chip.

(Operation of Stabilizing the Chromaticity in the Liquid Crystal Display Apparatus, and Combined Operation)

A third control program is supplied to the control circuit 33, and carried out is the third operation of maintaining designated chromaticity (such as white) even if conditions such as the temperature change. The circuitry shown in FIG. 11 is used.

Figure 14:
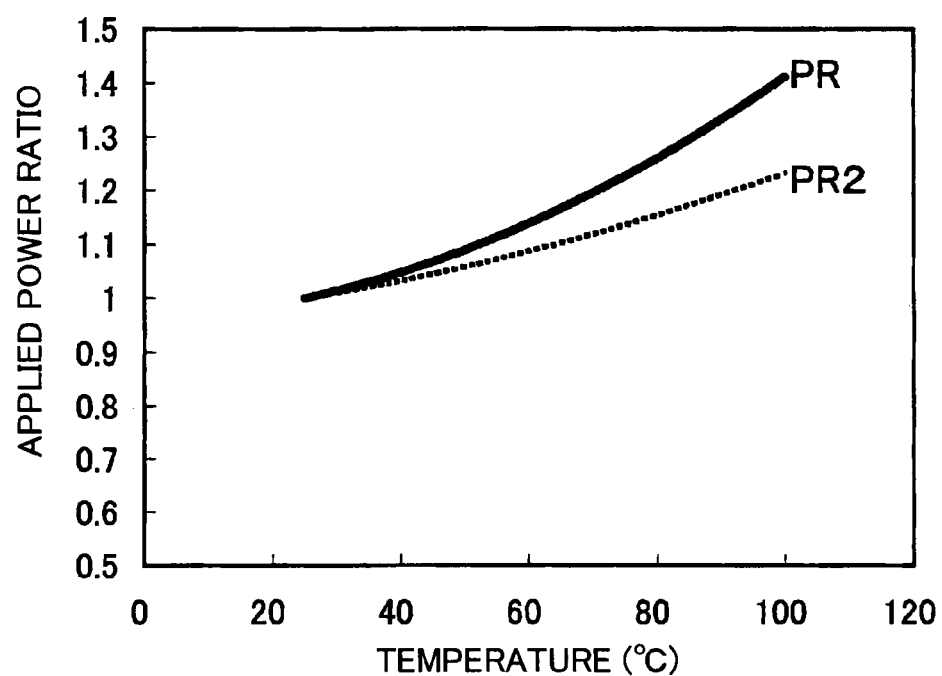
FIG. 14 shows a control program of the third operation in Embodiment 1.

As shown FIG. 14, in the third control program, average applied powers (time average of current×voltage) PR and PR2 respectively to the red LED and a red phosphor excitation blue LED are changed so that the red luminance is stabilized regardless of the temperature change. Here, the temperature dependency of the luminance of the red LED is estimated by data measured in advance. Moreover, the temperature change of the luminance of the red phosphor is estimated in light of the decrease in the emission intensity of the excitation blue LED, the change in the wavelength of the excitation blue LED, and the change in the conversion efficiency of the red phosphor.

Since the red luminance is kept constant by the third operation, the chromaticity that is a ratio among luminance of respective colors is kept constant. As with the red LED, each of the blue LED and the green LED is adjusted so that each luminance is kept constant regardless of the temperature change. Moreover, by providing the temperature sensor 34 in each backlight tile 12 and controlling each backlight tile 12, uneven chromaticity caused due to uneven temperature of each backlight tile is suppressed.

Figure 15:
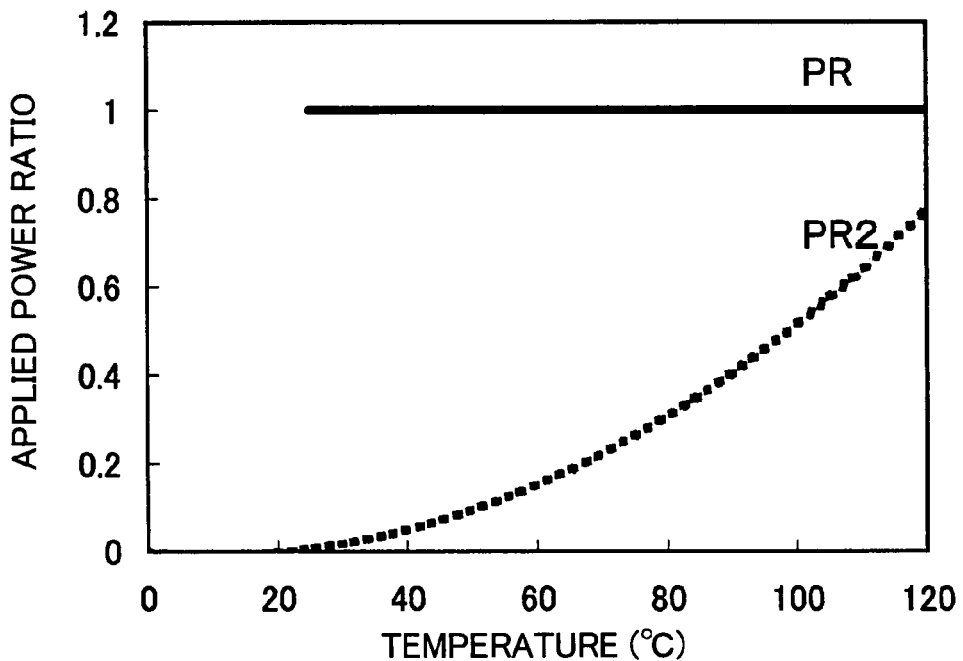
FIG. 15 shows a control program of the fourth operation in Embodiment 1.

Moreover, a fourth control program is supplied to the control circuit 33, and the fourth operation is carried out. As shown in FIG. 15, in the fourth control program, to stabilize the average applied power PR to the red LED and the chromaticity, the decreased luminance of the red LED due to the temperature change is compensated by increasing the average applied power PR2 to the red phosphor excitation blue LED. By this operation, it is possible to prevent the red LED from deteriorating, as with the second control program. Instead of stabilizing the power applied to the red LED regardless of the temperature, the power applied to the red LED may be decreased as the temperature increases, as with the second control program. In this case, burden on the red LED is further reduced.

In the third and fourth control programs, the chromaticity is estimated using the temperature sensor that is one temperature detecting means, and an operation of stabilizing the chromaticity is carried out. However, it may be possible to carry out an operation of using a color sensor which directly obtains the chromaticity to stabilize a color signal (chromaticity) obtained from the color sensor. Moreover, the signal from the color sensor and the signal from the temperature sensor may be combined. Moreover, in the present embodiment, the red color is light obtained by combining the light emission from the LED and the light emission from the phosphor. However, the red color may be replaced with the other color (for example, yellow or green).

Figure 16:
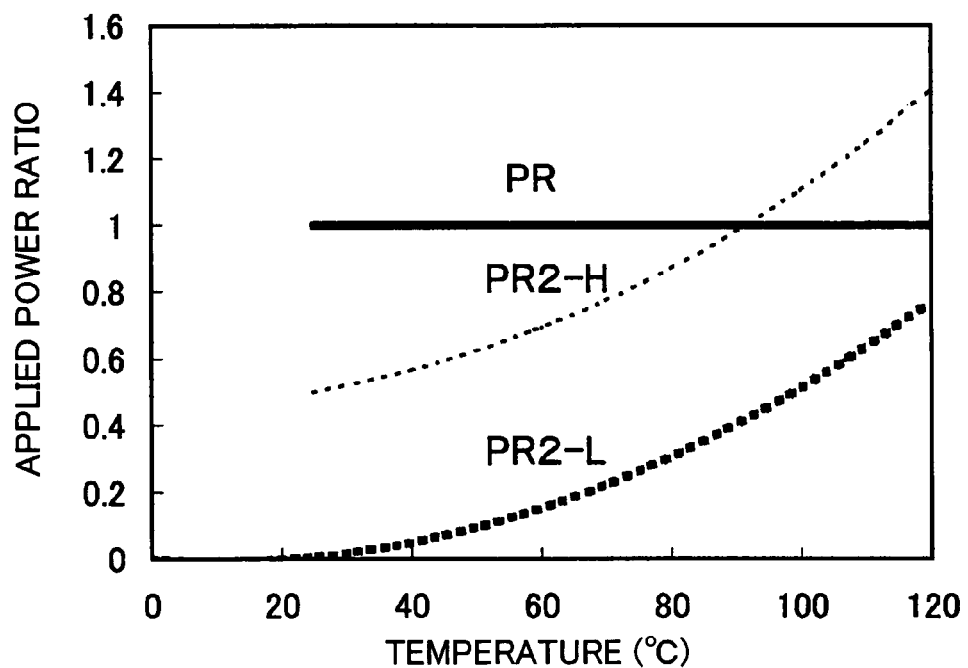
FIG. 16 shows a control program of a fifth operation of Embodiment 1.

A fifth control program is a combination of (i) the fourth control program and (i) the control, used in the first control program, corresponding to the image luminance. In FIG. 16, the average applied power to the red phosphor excitation blue LED when the luminance is low is PR2-L, and the average applied power to the red phosphor excitation blue LED when the luminance is high is PR2-H. When the luminance is required to some extent, the increased luminance is compensated by the light emission (difference between PR2-H and PR2-L) from the phosphor. Thus, it is possible to carry out an operation of obtaining as excellent the color reproducibility as possible while suppressing the deterioration of the red LED.

(Configuration not Including the Liquid Crystal Panel)

In the liquid crystal display apparatus 10 of Embodiment 1, a backlight portion not including the liquid crystal panel 14 functions as a light emitting apparatus, such as the lighting apparatus. In this light emitting apparatus, "the operation corresponding to the luminance of the image" described above can be changed to "an operation corresponding to required illuminance or luminance". Moreover, "the operation of changing the ratio between the light emission from the LED and the light emission from the phosphor in accordance with the temperature" is carried out to carry out such light emission that excessive burden is not applied to the LED which emits light whose color is the same as or similar to the color of light emitted from the phosphor. In addition, the chromaticity can be stabilized or be set to a required color.

Embodiment 2

In Embodiment 2, the LED group 19 used in Embodiment 1 is replaced with an LED group 59, and both the green LED chip and a green light emitting phosphor are used for the green color. Moreover, the color sensor is used to control the ratio between the light from the LED chip and the light from the phosphor to obtain the color balance. Thus, it is possible to obtain a display apparatus which uses the red light emitting phosphor having excellent temperature characteristics and the green light emitting phosphor having excellent light emitting efficiency to obtain high luminance even at high temperature.

Figure 17:
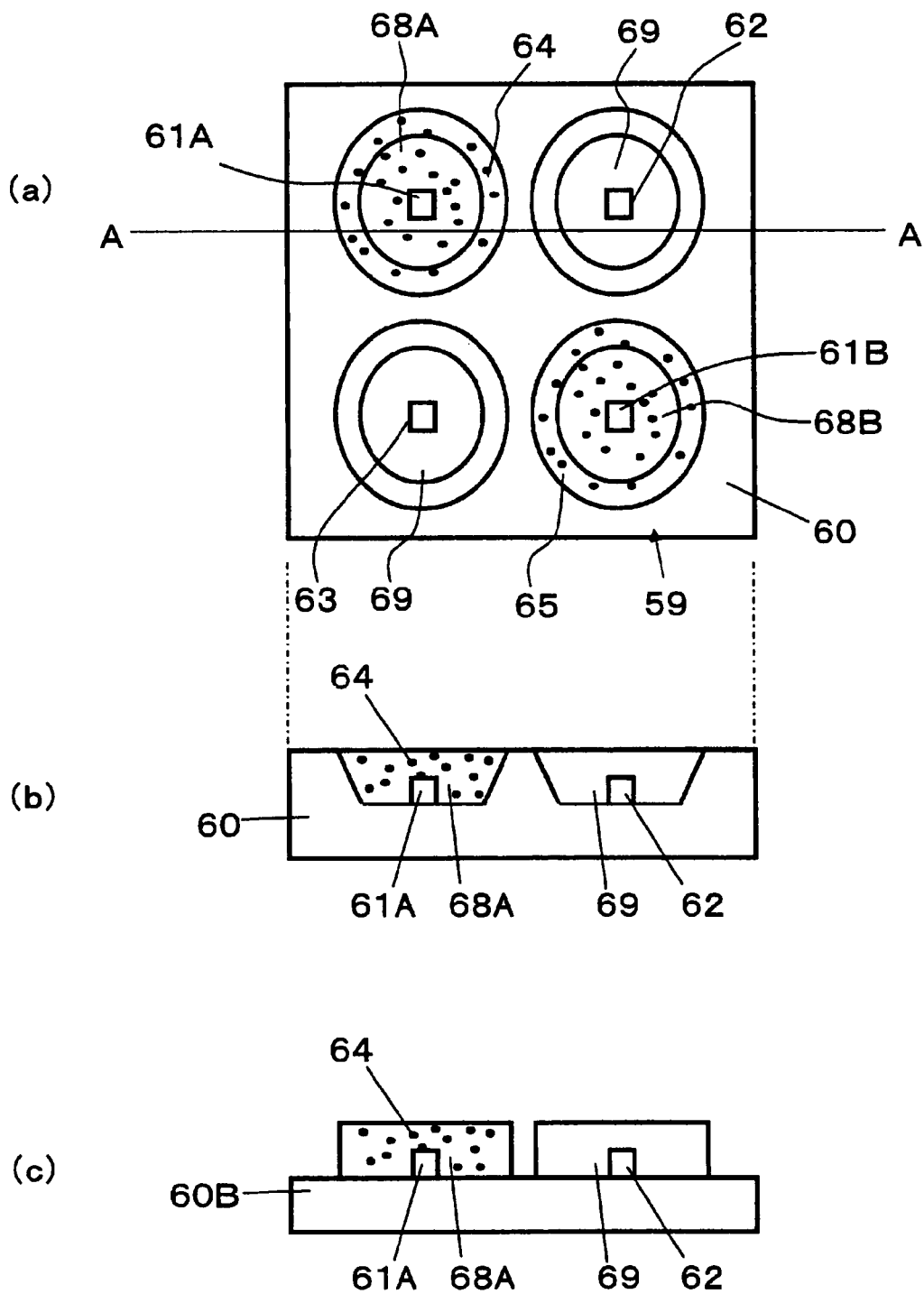
FIG. 17($a$) is a top view of an LED group used in Embodiment 2, FIG. 17($b$) is a cross-sectional diagram of the LED group, and FIG. 17($c$) is a cross-sectional diagram of a modification example of the LED group.

FIG. 17(a) is a top view of the LED group 59, and FIG. 17(b) is its cross-sectional diagram. A first blue LED chip 61A, a green LED chip 62, a second blue LED chip 61B and a red LED chip 63 are mounted on a package 60. Green light emitting phosphors 64 are dispersed in a first resin 68A which covers the first blue LED chip 61A, and red light emitting phosphors 65 are dispersed in a second resin 68B which covers the second blue LED chip 61B. Each of the first blue LED chip 61A and the second blue LED chip 61B doubles as a phosphor excitation light source and a blue light source, and a component which has scattered or penetrated without exciting the phosphor is used as the blue light source. Each of the green LED chip 62 and the red LED chip 63 is covered with a silicone resin 69 which does not contain phosphors. Note that the blue LED chip 61A, the blue LED chip 61B and the green LED chip 62 are the AlGaInN based LEDs, and the red LED chip 63 is the AlGaInP based LED.

The green light emitting phosphor 64 is at least one type selected from α sialon (α-Si, Al, O, N:$Ce^{3+}$), β sialon (β-Si, Al, O, N:$Eu^{2+}$), Sr aluminate ($SrAl_2O_4$:$Eu^{2+}$), (Sr, Ba)$_2$$SiO_4$:$Eu^{2+}$, $Ca_3$(Sc, Mg)$_2$$Si_3O_{12}$:$Ce^{3+}$, etc.

As with the red light emitting phosphor 25, the red light emitting phosphor 65 is $CaAlSiN_3$:$Eu^{2+}$.

FIG. 17(c) is a cross-sectional diagram of an LED group which uses a package 60B obtained by excluding the reflection surface from the package 60 shown in FIGS. 17(a) and 17(b). As with the package 20B described in Embodiment 1, the resin 69, etc. and the reflection surface of the package are separated from each other, so that the same effects as above can be obtained (for example, detachment at the reflection surface does not occur, and wide light can be obtained).

(Control of White Balance)

Figure 18:
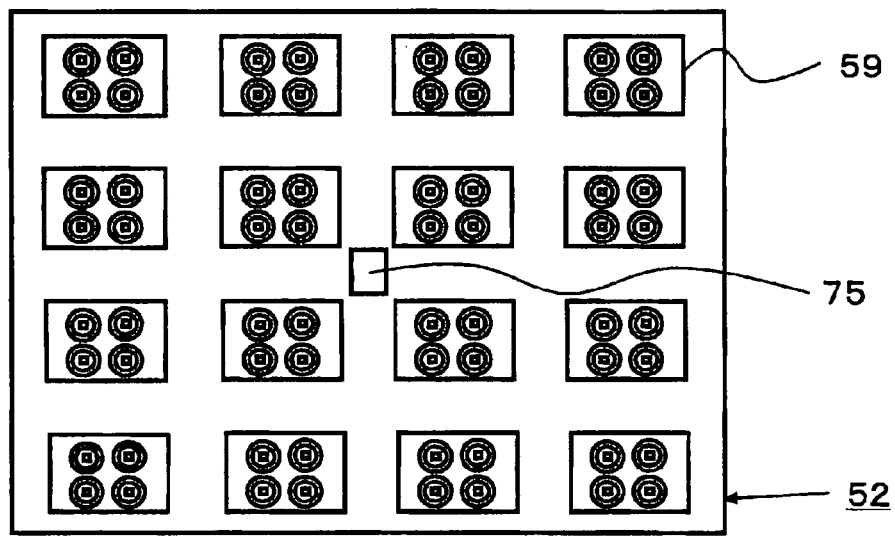
FIG. 18 is a schematic diagram showing a surface of a backlight tile of Embodiment 2.
Figure 19:
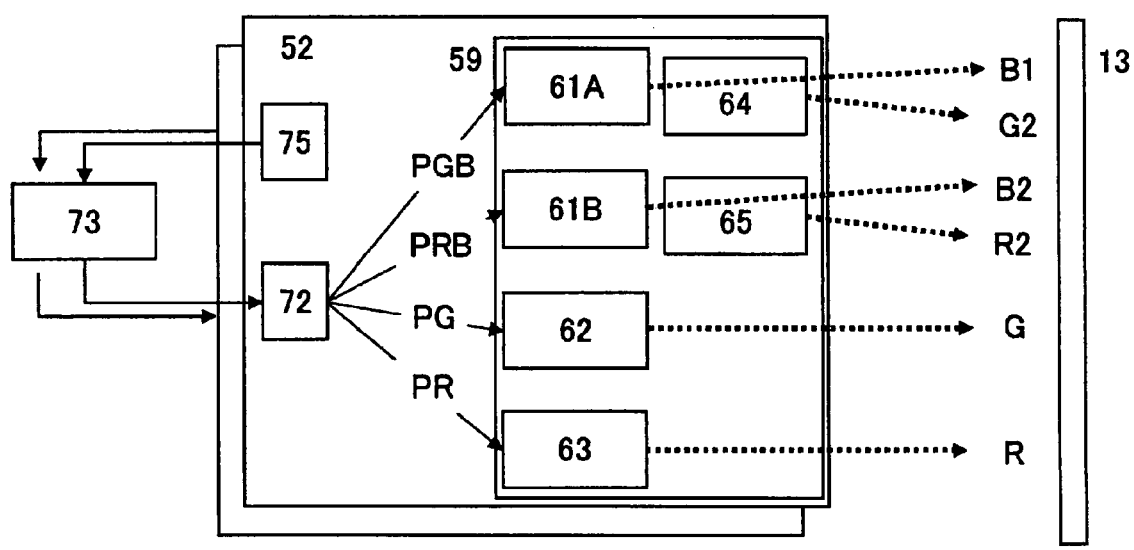
FIG. 19 is a circuitry diagram in Embodiment 2.

FIG. 18 is a diagram showing a surface of a backlight tile 52 of the present embodiment. In addition to the LED groups 59, a color sensor 75 that is a set of sensors each for detecting the mount of red light, green light or blue light is provided at substantially the center of the backlight tile 52. The circuitry diagram is shown in FIG. 19. The chromaticity and luminance of light which is emitted from the LED group 59 on the backlight tile 52, mainly reflected by the diffuser plate 13 (see FIG. 1 of Embodiment 1) and detected by the color sensor 75 are transferred to a control circuit 73 provided outside the backlight tile 52. The control circuit 73 transfers to a drive circuit 72 (provided on a back surface of the backlight tile 52) a signal for adjusting the average applied powers to the LED chips constituting the LED group 59 so that the chromaticity and the luminance become set values.

As shown in FIG. 19, the amount of blue light is a sum of (i) light B1 determined by an average applied power PGB to the first blue LED chip 61A and (ii) light B2 determined by an average applied power PRB to the second blue LED chip 61B. The amount of green light is a sum of (i) light G2, from the green light emitting phosphor 64, determined by the average applied power PGB to the first blue LED chip 61A and (ii) light G determined by the average applied power PG to the green LED chip 62. The amount of red light is a sum of (i) light R2, from the red light emitting phosphor 65, determined by an average applied power PGR to the second blue LED chip 61B and (ii) light R determined by an average applied power PR to the red LED chip 63. A predetermined chromaticity can be obtained when the ratio among the amount of blue light, the amount of green light and the amount of red light becomes a predetermined value.

In the present embodiment, a color of light that is a sum of (i) light emitted from the phosphor excitation blue LED chip 61A as the blue light, (ii) light emitted from the blue LED chip 61B as blue light, (iii) fluorescence emitted from the green light emitting phosphor 64 and (iv) fluorescence emitted from the red light emitting phosphor 65 is adjusted so as to be a white color in which the amount of blue components is larger than the amount of other components (red components, green components). Therefore, insufficient green color components and red color components are compensated by using the green LED chip 62 and the red LED chip 63. Thus, by adjusting the amount of light of each of these four LED chips on the basis of the signal of the color sensor 75, it is possible to obtain the white color or a set color as a whole.

Since the green color and the red color can be obtained by the light emission of the phosphor to some extent, the present embodiment is advantageous in that it is hardly affected by the temperature change, etc. Another advantage is that a predetermined color can be obtained by obtaining insufficient green color and red color using both the green LED chip and the red LED chip. By further adding, to the LED group of the present embodiment, the blue LED chip that is an independent blue light source, the blue LED chips 61A and 61B do not have to emit light to obtain the amount of blue light. Since the amount of light of each color can be controlled independently, the operations described in Embodiment 1 can be realized.

The present embodiment uses the color sensor which can detect three colors separately. However, the amount of light emission of each color can be detected by (i) using an optical sensor which can detect only the amount of light (which can not identify colors) and (ii) causing the LEDs to be operated in a time-divisional manner. By this time-divisional operation, it is possible to carry out the feedback control so that the color of light emitted from the LED group becomes a set value.

Moreover, the average applied powers to respective LED chips may be controlled so that (i) without using the color sensor, a correlation among the temperature, the chromaticity and the luminance is obtained in advance as in Table 1, (ii) the chromaticity is estimated from the temperature and the average applied powers to respective LED chips, and (iii) the chromaticity estimated in accordance with the temperatures detected by the temperature sensor used in Embodiment 1 becomes a set value.

Embodiment 3

In Embodiment 3, one blue LED chip excites two types of phosphors. Therefore, the number of chips in Embodiment 3 is reduced by 1 as compared with that in Embodiment 2. Embodiment 3 only explains the LED group and its operation which are different from those in Embodiment 2. Same reference numerals are used for the members having the same functions as the members in the above embodiments.

Figure 20:
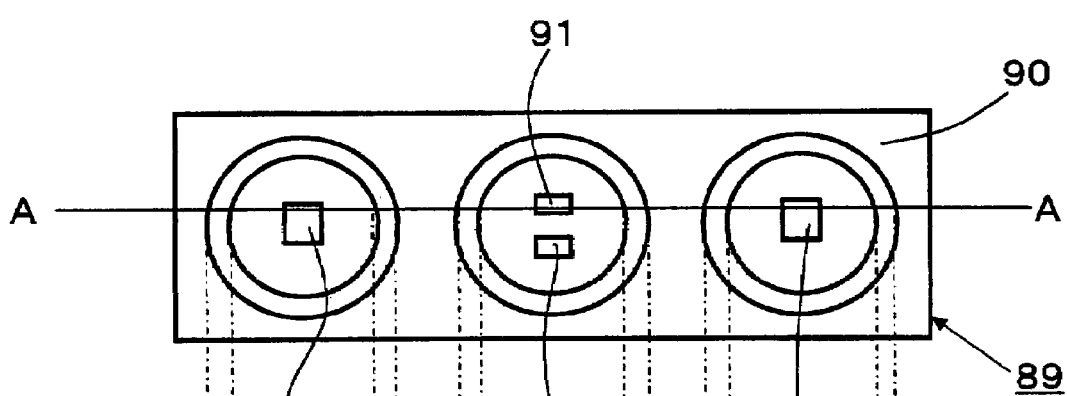
FIG. 20($a$) is a top view of an LED group used in Embodiment 3, and FIG. 20($b$) is a cross-sectional diagram of the LED group.
Figure 20:
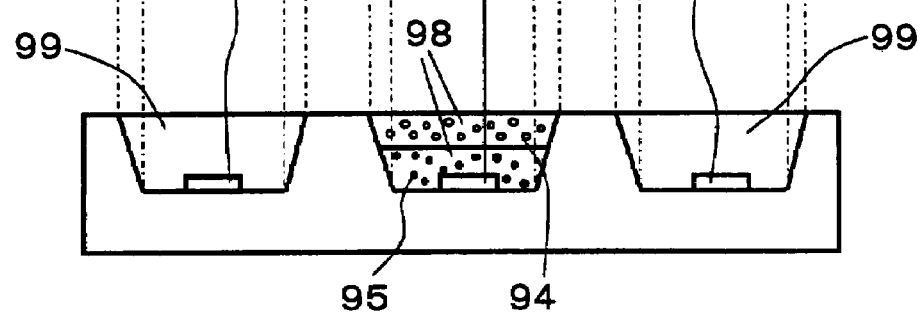

As shown in FIG. 20(a) that is the top view and FIG. 20(b) that is the cross-sectional diagram, an LED group 89 is obtained by mounting two blue LED chips 91, a green LED chip 92 and a red LED chip 93 on a package 90. A resin 98 is filled so as to seal the blue LED chips. The resin 98 has two layers. Red light emitting phosphors 95 are dispersed in one layer which is closer to the blue LED chips 91, and green light emitting phosphors 94 are dispersed in another layer which is away from the blue LED chips 91. This is preferable since the percentage of light emission which is from the green light emitting phosphors 94 and absorbed by the red light emitting phosphor 95 decreases. Two layers are formed since this is complex in manufacturing. In the case of realizing a simpler structure, the green light emitting phosphors 94 and the red light emitting phosphors 95 may be simply mixed and dispersed in the resin 98 which covers the blue LED chips 91, although part of light emitted from the green light emitting phosphors 94 is absorbed by the red light emitting phosphors 95, so that the light emitting efficiency deteriorates. In addition, the green LED chip 92, the red LED chip 93 and the resin 98 are covered with a silicone resin 99. The number of the blue LED chips 91 sealed by the resin 98 may be accordingly set in accordance with the density of the phosphors so that the balance between the amounts of light of respective colors can be maintained. The number of the blue LED chips 91 may be not 2, but may be 1 or may be 3 or more.

(Control of White Balance)

The control circuit 73 carries out the feedback control so that the chromaticity and luminance detected by the color sensor 75 become set values. In the present embodiment, when the amount of light emission of the blue LED chip 91 is determined, the amount of green light emitted from the green light emitting phosphors 94 and the amount of red light emitted from the red light emitting phosphors 95 are also determined. In the present embodiment, the green LED chip 92 and the red LED chip 93 are used to compensate for insufficient green color and red color detected by the color sensor 75. In this way, it is possible to obtain the white color as a whole.

In the present embodiment, by further adding, to the LED group 89, a blue LED chip which does not excite phosphors, the degree of freedom of the operation method increases. In this case, it is possible to realize, for example, an operation which does not use light emission of phosphors.

Other Embodiments

Each of the above embodiments has explained an LED group obtained by mounting a plurality of LED chips on one package. However, it is possible to separately provide (i) lamps each of which is formed by a single LED chip of each color or (ii) lamps each of which is obtained by combining one LED chip and one or a plurality of phosphors.

The above embodiments have explained (i) an example in which the red LED chip and the red light emitting phosphor are combined with each other and (ii) an example in which the green LED chip and the green light emitting phosphor are combined with each other. However, the yellow LED chip (for example, the AlGaInP based LED) and the yellow light emitting phosphor (for example, a Ce:YAG phosphor, $(Sr, Ba)_2SiO_4:Eu^{2+}$, or $\alpha$ sialon ($\alpha$-Si, Al, O, N:$Eu^{2+}$)) may be combined with each other.

The above embodiments have explained an operation of emitting the white color by combining lights of the blue, green and red light emitting elements. However, the chromaticity and luminance may be changed in accordance with, for example, an image to be displayed. When the image to be displayed is a night scene for example, the luminance may be decreased as a whole, and when it is sea and sky, the blue color may be mainly emitted. The adjustment of the chromaticity and luminance may be carried out uniformly for the entire backlight, but may be carried out for each backlight tile, or for each LED group.

The present invention is not limited to the description of the embodiments above, but may be altered by a skilled person within the scope of the claims. An embodiment based on a proper combination of technical means disclosed in different embodiments is encompassed in the technical scope of the present invention.

(Generalization of the Embodiments)

It is preferable that the light emitting apparatus of the present embodiment further include: a third LED; a fourth LED; and a second phosphor which is excited by the second LED or the fourth LED, and emits light whose color is the same as or similar to a color of light emitted from the third LED, and the control circuit control a ratio among the emission intensity of the first LED, the emission intensity of the second LED, an emission intensity of the third LED and an emission intensity of the fourth LED.

In the light emitting apparatus of the present embodiment, it is preferable that the control circuit control the ratio in accordance with a first emission intensity obtained by light emission of the first LED, light emission of the first phosphor, or both the light emission of the first LED and the light emission of the first phosphor.

In the light emitting apparatus of the present embodiment, it is preferable that the control circuit increase a ratio of the emission intensity of the second LED to the emission intensity of the first LED so that the first emission intensity is increased to be equal to or more than a predetermined value. The above expression "increase a ratio" includes a case where the emission intensity of the first LED is set to zero.

In the light emitting apparatus of the present embodiment, it is preferable that the control circuit control the ratio in accordance with a temperature of the light emitting apparatus.

It is preferable that the light emitting apparatus of the present embodiment further include temperature detecting means, and the temperature detecting means detect the temperature of the light emitting apparatus. Note that the temperature detecting means may be a temperature sensor, means for measuring a forward voltage of an LED used, etc.

In the light emitting apparatus of the present embodiment, it is preferable that the control circuit increase a ratio of the emission intensity of the second LED to the emission intensity of the first LED when the temperature of the light emitting apparatus is higher than a predetermined value.

In the light emitting apparatus of the present embodiment, it is preferable that the control circuit control the ratio in accordance with chromaticity of the light emitting apparatus.

In the light emitting apparatus of the present embodiment, it is preferable that the control circuit adjust a ratio of the emission intensity of the second LED to the emission intensity of the first LED so that the chromaticity of the light emitting apparatus becomes a predetermined value.

It is preferable that the light emitting apparatus of the present embodiment further include a color sensor, and the color sensor detect the chromaticity of the light emitting apparatus.

It is preferable that the light emitting apparatus of the present embodiment further include temperature detecting means, and the temperature detecting means estimate the chromaticity of the light emitting apparatus.

In the present embodiment, it is preferable that a half band width of an emission spectrum of the first phosphor be wider than a half band width of an emission spectrum of the first LED.

In the light emitting apparatus of the present embodiment, it is preferable that the second LED be a blue LED.

In the light emitting apparatus of the present embodiment, it is preferable that the fourth LED be a blue LED.

It is preferable that the second LED be a purple LED or a ultraviolet LED in the light emitting apparatus of the present embodiment, and the light emitting apparatus further include a blue LED.

It is preferable that the fourth LED be a purple LED or a ultraviolet LED, and the light emitting apparatus further include a blue LED.

In the light emitting apparatus of the present embodiment, it is preferable that the first LED be a red LED, and the first phosphor be a phosphor which emits red light.

In the light emitting apparatus of the present embodiment, it is preferable that the first LED or the third LED be a red LED, and the first phosphor or the second phosphor be a phosphor which emits red light.

In the light emitting apparatus of the present embodiment, it is preferable that the red LED be an AlGaInP based red LED.

In the light emitting apparatus of the present embodiment, it is preferable that the first phosphor be $CaAlSiN_3:Eu^{2+}$.

In the light emitting apparatus of the present embodiment, it is preferable that the first LED be a green LED, and the first phosphor be a phosphor which emits green light.

In the light emitting apparatus of the present embodiment, it is preferable that the first LED or the third LED be a green LED, and the first phosphor or the second phosphor be a phosphor which emits green light.

In the light emitting apparatus of the present embodiment, it is preferable that the second phosphor be $\alpha$ sialon, $\beta$ sialon, Sr aluminate, $(Sr,Ba)_2SiO_4:Eu^{2+}$ or $Ca_3(Sc,Mg)_2Si_3O_{12}:Ce^{3+}$.

In the light emitting apparatus of the present embodiment, it is preferable that the third LED be a yellow LED, and the second phosphor be a phosphor which emits yellow light.

In the light emitting apparatus of the present embodiment, it is preferable that the second phosphor be $\alpha$ sialon, $(Sr,Ba)_2SiO_4:Eu^{2+}$ or $YAG:Ce^{3+}$.

A display apparatus of the present embodiment includes the light emitting apparatus, a non light emitting display panel and a color filter.

A method for controlling the light emitting apparatus of the present embodiment is a method for controlling a light emitting apparatus including a first LED, a second LED, and a phosphor which is excited by the second LED and emits light whose color is the same as or similar to a color of light emitted from the first LED, and the method includes the step of increasing a ratio of an emission intensity of the second LED to an emission intensity of the first LED so that a first emission intensity is increased to be equal to or more than a predetermined value, the first emission intensity being obtained by light emission of the first LED, light emission of the first phosphor, or both the light emission of the first LED and the light emission of the first phosphor.

A method for controlling the light emitting apparatus of the present embodiment is a method for controlling a light emitting apparatus including a first LED, a second LED, and a phosphor which is excited by the second LED and emits light whose color is the same as or similar to a color of light emitted from the first LED, and the method includes the step of increasing a ratio of an emission intensity of the second LED to an emission intensity of the first LED when a temperature of the light emitting apparatus is higher than a predetermined value.

A method for controlling the light emitting apparatus of the present embodiment is a method for controlling a light emitting apparatus including a first LED, a second LED, and a phosphor which is excited by the second LED and emits light whose color is the same as or similar to a color of light emitted from the first LED, and the method includes the step of adjusting a ratio of an emission intensity of the second LED to an emission intensity of the first LED so that chromaticity of the light emitting apparatus becomes a predetermined value.

A method for controlling the light emitting apparatus of the present embodiment simultaneously carries out at least two of the above steps.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A light emitting apparatus, comprising:
   a first LED;
   a second LED;
   a first phosphor which is excited by the second LED and emits light whose color is the same as or similar to a color of light emitted from the first LED; and
   a control circuit which controls a ratio between an emission intensity of the first LED and an emission intensity of the second LED.

2. The light emitting apparatus as set forth in claim 1, further comprising:
   a third LED;
   a fourth LED; and
   a second phosphor which is excited by the second LED or the fourth LED, and emits light whose color is the same as or similar to a color of light emitted from the third LED,
   the control circuit controlling a ratio among the emission intensity of the first LED, the emission intensity of the second LED, an emission intensity of the third LED and an emission intensity of the fourth LED.

3. The light emitting apparatus as set forth in claim 1, wherein the control circuit controls the ratio in accordance with a first emission intensity obtained by light emission of the first LED, light emission of the first phosphor, or both the light emission of the first LED and the light emission of the first phosphor.

4. The light emitting apparatus as set forth in claim 3, wherein the control circuit increases a ratio of the emission intensity of the second LED to the emission intensity of the first LED so that the first emission intensity is increased to be equal to or more than a predetermined value.

5. The light emitting apparatus as set forth in claim 1, wherein the control circuit controls the ratio in accordance with a temperature of the light emitting apparatus.

6. The light emitting apparatus as set forth in claim 5, further comprising:
   temperature detecting means,
   the temperature detecting means detecting the temperature of the light emitting apparatus.

7. The light emitting apparatus as set forth in claim 5, wherein the control circuit increases a ratio of the emission intensity of the second LED to the emission intensity of the first LED when the temperature of the light emitting apparatus is higher than a predetermined value.

8. The light emitting apparatus as set forth in claim 1, wherein the control circuit controls the ratio in accordance with chromaticity of the light emitting apparatus.

9. The light emitting apparatus as set forth in claim 8, wherein the control circuit adjusts a ratio of the emission intensity of the second LED to the emission intensity of the first LED so that the chromaticity of the light emitting apparatus becomes a predetermined value.

10. The light emitting apparatus as set forth in claim 8, further comprising:
a color sensor,
the color sensor detecting the chromaticity of the light emitting apparatus.

11. The light emitting apparatus as set forth in claim 8, further comprising:
temperature detecting means,
the temperature detecting means estimating the chromaticity of the light emitting apparatus.

12. The light emitting apparatus as set forth in claim 1, wherein a half band width of an emission spectrum of the first phosphor is wider than a half band width of an emission spectrum of the first LED.

13. The light emitting apparatus as set forth in claim 1, wherein the second LED is a blue LED.

14. The light emitting apparatus as set forth in claim 2, wherein the fourth LED is a blue LED.

15. The light emitting apparatus as set forth in claim 1, wherein the second LED is a purple LED or a ultraviolet LED, and
the light emitting apparatus further comprising a blue LED.

16. The light emitting apparatus as set forth in claim 2, wherein the fourth LED is a purple LED or a ultraviolet LED, and
the light emitting apparatus further comprising a blue LED.

17. The light emitting apparatus as set forth in claim 1, wherein the first LED is a red LED, and the first phosphor is a phosphor which emits red light.

18. The light emitting apparatus as set forth in claim 2, wherein the first LED or the third LED is a red LED, and the first phosphor or the second phosphor is a phosphor which emits red light.

19. The light emitting apparatus as set forth in claim 17, wherein the red LED is an AlGaInP based red LED.

20. The light emitting apparatus as set forth in claim 17, wherein the first phosphor is $CaAlSiN_3:Eu^{2+}$.

21. The light emitting apparatus as set forth in claim 1, wherein the first LED is a green LED, and the first phosphor is a phosphor which emits green light.

22. The light emitting apparatus as set forth in claim 2, wherein the first LED or the third LED is a green LED, and the first phosphor or the second phosphor is a phosphor which emits green light.

23. The light emitting apparatus as set forth in claim 21, wherein the second phosphor is $\alpha$ sialon, $\beta$ sialon, Sr aluminate, $(Sr,Ba)_2SiO_4:Eu^{2+}$ or $Ca_3(Sc,Mg)_2Si_3O_{12}:Ce^{3+}$.

24. The light emitting apparatus as set forth in claim 2, wherein the third LED is a yellow LED, and the second phosphor is a phosphor which emits yellow light.

25. The light emitting apparatus as set forth in claim 24, wherein the second phosphor is $\alpha$ sialon, $(Sr,Ba)_2SiO_4:Eu^{2+}$ or $YAG:Ce^{3+}$.

26. A display apparatus, comprising:
a light emitting apparatus, comprising:
a first LED;
a second LED;
a first phosphor which is excited by the second LED, and emits light whose color is the same as or similar to a color of light emitted from the first LED; and
a control circuit which controls a ratio between an emission intensity of the first LED and an emission intensity of the second LED;
a non light emitting display panel; and
a color filter.

* * * * *